(12) United States Patent
Yao et al.

(10) Patent No.: US 8,773,194 B2
(45) Date of Patent: Jul. 8, 2014

(54) METHOD, APPARATUS AND SYSTEM FOR ADAPTIVELY ADJUSTING VOLTAGE

(71) Applicant: Huawei Technologies Co., Ltd, Shenzhen (CN)

(72) Inventors: Cong Yao, Shinghai (CN); Yu Liu, Shanghai (CN); Liqian Chen, Shanghai (CN); Xiang Li, Shanghai (CN); Jiqiang Gong, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/901,884

(22) Filed: May 24, 2013

(65) Prior Publication Data

US 2013/0321072 A1    Dec. 5, 2013

(30) Foreign Application Priority Data

May 31, 2012   (CN) .......................... 2012 1 0176477

(51) Int. Cl.
*G11C 7/04* (2006.01)
*G11C 5/14* (2006.01)

(52) U.S. Cl.
CPC . *G11C 5/147* (2013.01); *G11C 7/04* (2013.01)
USPC .......................................... 327/513; 327/540

(58) Field of Classification Search
CPC ............... G11C 7/04; G11C 11/40626; G11C 11/4074; G11C 5/147
USPC ......... 327/540, 530, 538, 541, 543, 544, 545, 327/546, 513; 365/226
See application file for complete search history.

(56) References Cited

U.S. PATENT DOCUMENTS

| | | | |
|---|---|---|---|
| 8,081,532 B2* | 12/2011 | Walker | 365/211 |
| 8,130,025 B2* | 3/2012 | Kutz | 327/513 |
| 2009/0016093 A1* | 1/2009 | Iwanari | 365/145 |

* cited by examiner

*Primary Examiner* — Lincoln Donovan
*Assistant Examiner* — Jung H Kim
(74) *Attorney, Agent, or Firm* — Slater & Matsil, L.L.P.

(57) ABSTRACT

The present invention discloses a method, an apparatus, and a system for adaptively adjusting a voltage. The method includes: acquiring an internal temperature code of a system chip and a time sequence code of a system logic circuit, where the internal temperature code is detected by a temperature sensor and the time sequence code is output by a time sequence monitoring unit; selecting a time sequence reference calibration code from multiple configured time sequence reference calibration codes according to the acquired temperature code; and comparing the acquired time sequence code with the selected time sequence reference calibration code and determining, according to a comparison result, an adjustment voltage to be output for a system load. By using the foregoing method, the present invention can better reduce a power loss and achieve a better power reduction effect.

11 Claims, 5 Drawing Sheets

METHOD, APPARATUS AND SYSTEM FOR ADAPTIVELY ADJUSTING VOLTAGE

CROSS-REFERENCE TO RELATED APPLICATIONS

This application claims priority to Chinese Patent Application No. 201210176477.6, filed on May 31, 2012, which is hereby incorporated by reference in its entirety.

FIELD OF THE INVENTION

The present invention relates to the field of communications technologies, and in particular to a method, an apparatus, and a system for adaptively adjusting a voltage.

BACKGROUND OF THE INVENTION

In recent years, with rapid development of the mobile Internet and electronic technologies, a mobile terminal is more and more widely used as a carrier. However, as a mobile terminal is increasingly powerful, its power consumption is also increasingly higher. Therefore, a design of lower power consumption has become an important factor for consideration during a product design.

Currently, existing low power consumption technologies are mainly a dynamic voltage frequency scaling (DVFS, Dynamic Voltage Frequency Scaling) technology, an adaptive voltage scaling (AVS, Adaptive Voltage Scaling) technology, and the like. For example, among existing low power consumption technologies, AVS can adaptively seek a lowest operating voltage point in a case where a performance grade is given, so as to save power consumption. FIG. 1 is a schematic diagram of a method for adjusting a voltage by using the AVS technology in the prior art. According to this method, a time sequence code output by a time sequence monitoring unit is compared with a time sequence reference calibration code, voltage output of a power management unit is controlled according to a comparison result, and an output voltage further affects the time sequence code, so that a closed loop is formed. Any parameter, such as a process, a voltage, and a temperature (PVT, process, voltage, temperature), which affects a time sequence may result in a change in the time sequence code.

However, the inventor has found the following:

In the prior art, because certain time is needed to perform a voltage adjustment for the foregoing control loop, if a parameter such as a voltage or a temperature changes dramatically in this time, a logic time sequence error may be caused, and the control loop is not yet adjusted at this time. At the same time, a temperature characteristic curve of a chip is not linear, because a temperature changes, a temperature change within a unit time is also different. Therefore, a certain margin needs to be reserved when the AVS technology is utilized to adjust a voltage, and this margin needs to ensure that no logic error is caused under all conditions. However, this processing method reduces an effect of reducing power consumption. Therefore, a method for adjusting a voltage in the prior art also has a relatively large power loss. This affects the power reduction effect.

SUMMARY OF THE INVENTION

To resolve the foregoing technical issue, a technical solution used in embodiments of the present invention is providing a method, an apparatus, and a system for adaptively adjusting a voltage, which can better reduce a power loss and achieve a better power reduction effect.

According to one aspect, the present invention provides a method for adaptively adjusting a voltage, including:

acquiring an internal temperature code of a system chip and a time sequence code of a system logic circuit, where the internal temperature code is detected by a temperature sensor and the time sequence code is output by a time sequence monitoring unit;

selecting a time sequence reference calibration code from multiple configured time sequence reference calibration codes according to the acquired temperature code; and comparing the acquired time sequence code with the selected time sequence reference calibration code and determining, according to a comparison result, an adjustment voltage to be output for a system load.

According to another aspect, the present invention provides a control apparatus, including:

an information acquiring unit, adapted to acquire an internal temperature code of a system chip and a time sequence code of a system logic circuit, where the internal temperature code is detected by a temperature sensor and the time sequence code is output by a time sequence monitoring unit;

a selecting unit, adapted to select a time sequence reference calibration code from multiple configured time sequence reference calibration codes according to the acquired temperature code; and a processing unit, adapted to compare the acquired time sequence code with the selected time sequence reference calibration code and determine, according to a comparison result, an adjustment voltage to be output for a system load.

According to still another aspect, the present invention provides a system for adaptively adjusting a voltage, including:

a temperature sensor, adapted to detect a current temperature inside a system chip and output a temperature code;

a time sequence monitoring unit, adapted to monitor a path time sequence of a system logic circuit and output a time sequence code; and a control logic module, adapted to: acquire the internal temperature code of the system chip and the time sequence code of the system logic circuit, where the internal temperature code is detected by the temperature sensor and the time sequence code is output by the time sequence monitoring unit; select a time sequence reference calibration code from multiple configured time sequence reference calibration codes according to the acquired temperature code; and compare the acquired time sequence code with the selected time sequence reference calibration code and determine, according to a comparison result, an adjustment voltage to be output for a system load.

Beneficial effects of the present invention are as follows: according to technical solutions in the embodiments of the present invention, a time sequence reference calibration code is selected from multiple configured time sequence reference calibration codes accordingly by acquiring an internal temperature code of a system chip and a time sequence code of a system logic circuit, where the internal temperature code is detected by a temperature sensor and the time sequence code is output by a time sequence monitoring unit; when a temperature is high, a corresponding time sequence code changes greatly and a time sequence reference calibration code with a large numerical value may be selected, and when a temperature is low, a corresponding time sequence code changes slightly and a time sequence reference calibration code with a small numerical value may be selected; therefore, only a small voltage margin may be reserved when the time sequence code does not change fiercely, and a large voltage margin is reserved only when the time sequence code changes fiercely. In this way, a corresponding time sequence reference calibration code may be selected according to a temperature code, and then a comparison is made between the acquired time sequence code and the selected time sequence reference calibration code, so that an adjustment voltage of a system load may be determined according to a comparison result. Therefore, a method according to the embodiments of the present invention may adaptively select different time sequence reference calibration codes according to a temperature range, and further a voltage may be automatically adjusted along with a change in an ambient temperature, thereby reducing system power consumption.

DETAILED DESCRIPTION OF THE EMBODIMENTS

An embodiment of the present invention provides a method for adaptively adjusting a voltage, so that a power loss can be better reduced and a better power reduction effect is achieved. The present invention mainly uses a way of temperature model approximation and resolves an issue that a power reduction effect is affected by a failure of AVS in the prior art to dynamically adjust a voltage margin according to a real temperature model.

Figure 1:
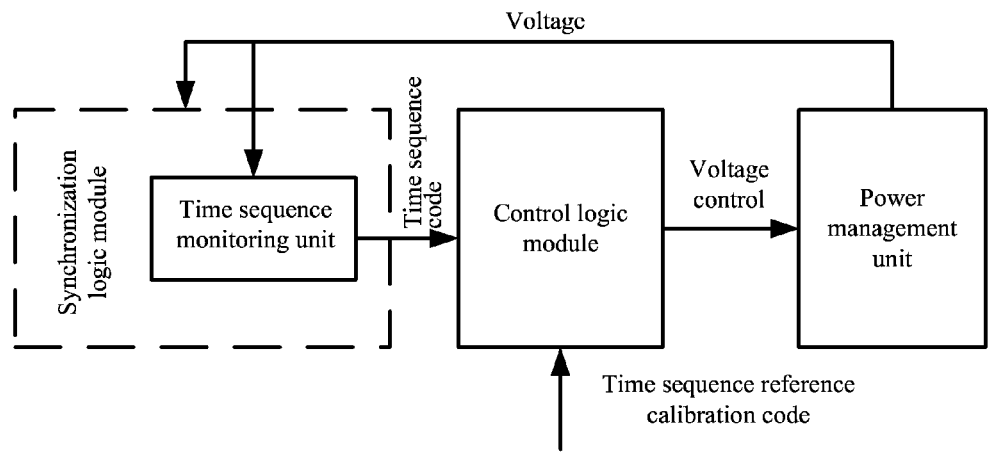
FIG. 1 is a schematic diagram of a method for adjusting a voltage by using the AVS technology in the prior art.
Figure 2:
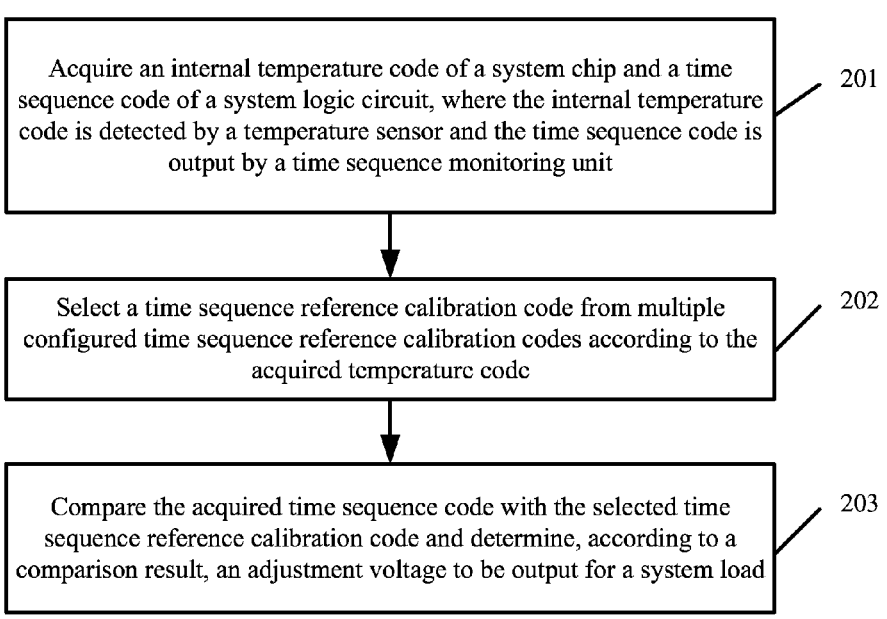
FIG. 2 is a flowchart of a method for adjusting a voltage according to an embodiment of the present invention.

Refer to FIG. 2, which is a flowchart of a method for adjusting a voltage according to an embodiment of the present invention.

As shown in FIG. 2, this embodiment of the present invention includes:

Step 201: Acquire an internal temperature code of a system chip and a time sequence code of a system logic circuit, where the internal temperature code is detected by a temperature sensor and the time sequence code is output by a time sequence monitoring unit.

The time sequence code in this step is a time sequence code that indicates delay information and is output after the time sequence monitoring unit mainly monitors a time sequence of a key path in a synchronization logic circuit. The temperature code is a temperature code that is output after the temperature sensor mainly monitors a junction temperature inside the system chip.

Step 202: Select a time sequence reference calibration code from multiple configured time sequence reference calibration codes according to the acquired temperature code.

The time sequence reference calibration code in this step is a configuration parameter that is output after a performance prediction unit makes a performance prediction according to a system load. The time sequence code may be output after an acquired synchronous clock is adjusted, where the synchronous clock is configured according to the system load. This step includes: selecting a corresponding time sequence reference calibration code from multiple configured time sequence reference calibration codes according to a range to which the acquired temperature code belongs. For a range in which a temperature code is high, a time sequence code changes greatly and a time sequence reference calibration code with a large numerical value may be selected, so that a large voltage margin is reserved accordingly for an adjustment voltage of the system load; and for a range in which a temperature code is low, a time sequence code changes slightly and a time sequence reference calibration code with a small numerical value may be selected, so that a small voltage margin is reserved accordingly for an adjustment voltage of the system load.

In this step, a corresponding time sequence reference calibration code may be selected from a time sequence reference calibration code parameter register with a multi-path selection structure according to the range to which the acquired temperature code belongs.

Step 203: Compare the acquired time sequence code with the selected time sequence reference calibration code and determine, according to a comparison result, an adjustment voltage to be output for the system load.

In this step, an adjustment voltage of the system load may be determined according to the comparison result, so that a voltage may be automatically adjusted along with a change in an ambient temperature. If the acquired time sequence code is smaller than the time sequence reference calibration code, it indicates that currently the internal time sequence of the system chip does not meet a current load and a voltage of the system load needs to be raised; if the acquired time sequence code is larger than the time sequence reference calibration code, it indicates that the internal time sequence of the current system chip is superior to a time sequence that is needed by the current load, and in this case a voltage of the system load may be reduced to save power.

Different from the prior art, in a technical solution according to this embodiment of the present invention, a time sequence reference calibration code is selected from multiple configured time sequence reference calibration codes accordingly by acquiring an internal temperature code of the system chip and a time sequence code of the system logic circuit, where the internal temperature code is detected by the temperature sensor and the time sequence code is output by the time sequence monitoring unit; when a temperature is high, a corresponding time sequence code changes greatly and a time sequence reference calibration code with a large numeric value may be selected, and when a temperature is low, a corresponding time sequence code changes slightly and a time sequence reference calibration code with a small numeric value may be selected; therefore, only a small voltage margin may be reserved when the time sequence code does not change fiercely and a large voltage margin is reserved only when the time sequence code changes fiercely. In this way, a corresponding time sequence reference calibration code may be selected according to a temperature code, and then a comparison is made between the acquired time sequence code and the selected time sequence reference calibration code, so that an adjustment voltage to be output for the system load may be determined according to a comparison result. Therefore, according to the method in this embodiment of the present invention, different time sequence reference calibration codes may be adaptively selected according to a temperature range, and further a voltage may be automatically adjusted along with a change in an ambient temperature, thereby reducing an output of system power consumption.

The following describes a technical solution in an embodiment of the present invention in more detail.

Figure 3:
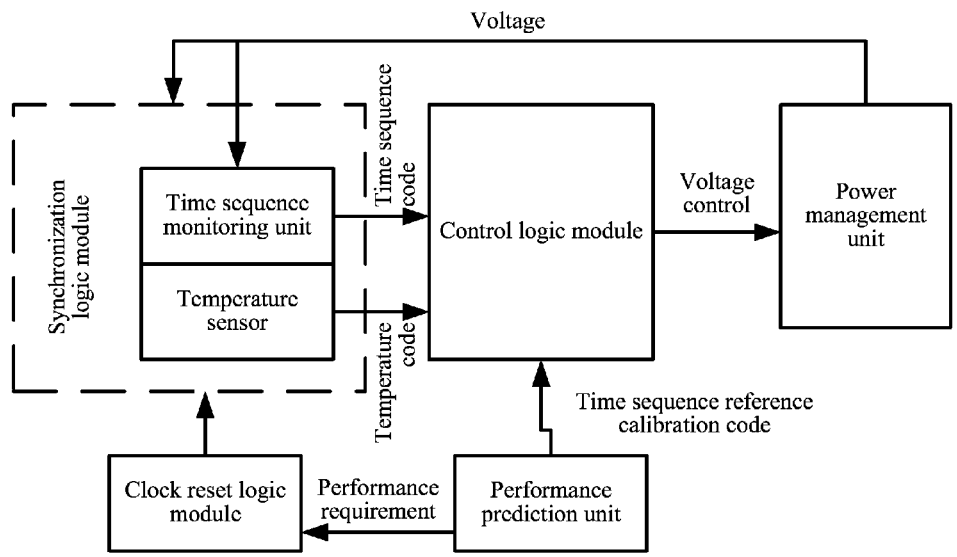
FIG. 3 is a first schematic diagram of a system for adjusting a voltage according to an embodiment of the present invention.

FIG. 3 is a first schematic diagram of a system for adjusting a voltage according to an embodiment of the present invention.

As shown in FIG. 3, major components of the system include a time sequence monitoring unit, a temperature sensor, a performance prediction unit, a clock reset logic module, a control logic module, and a power management unit.

First, functions of each unit are briefly described as follows:

The time sequence monitoring unit mainly monitors a time sequence of a key time sequence path in a synchronization logic circuit and outputs a time sequence code that indicates delay information. The temperature sensor mainly monitors a junction temperature inside a system chip, and outputs a temperature code. The performance prediction unit mainly makes a performance prediction according to a system load, and outputs a performance requirement parameter and a time sequence reference calibration code, where the performance requirement parameter is output to the clock reset logic module and the time sequence reference calibration code is output to the control logic module. The clock reset logic module mainly generates a synchronous clock according to the prediction made by the performance prediction unit for the system load, and outputs the synchronous clock to the time sequence monitoring unit, so that the time sequence code is output after the acquired synchronous clock is adjusted. The control logic module mainly selects a time sequence reference calibration code according to the temperature code output by the temperature sensor, compares the time sequence code output by the time sequence monitoring unit with the selected time sequence reference calibration code, and outputs a voltage control signal to the power management unit according to a comparison result. If the acquired time sequence code is smaller than the time sequence reference calibration code, it indicates that currently the internal time sequence of the system chip does not meet a current load and a voltage of the system load needs to be raised; if the acquired time sequence code is larger than the time sequence reference calibration code, it indicates that the internal time sequence of the current system chip is superior to a time sequence that is needed by the current load, and in this case a voltage of the system load may be reduced to save power. The power management unit mainly adjusts a voltage according to the voltage control signal output by the control logic module.

Figure 4:
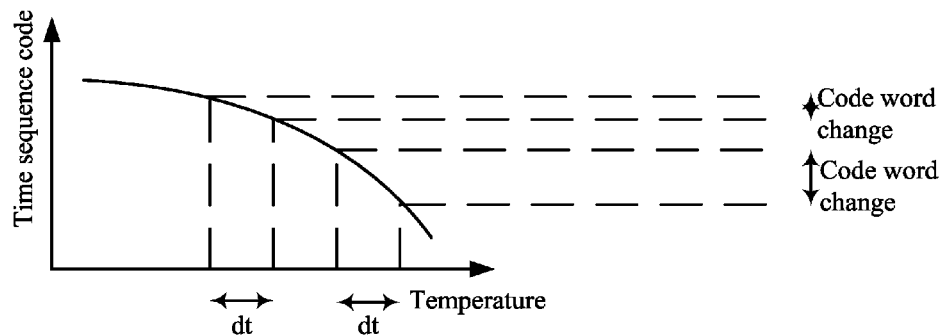
FIG. 4 is a schematic curve diagram of time sequence codes and temperatures according to an embodiment of the present invention.
Figure 5:
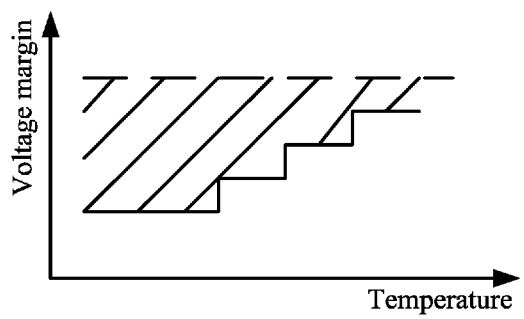
FIG. 5 is a schematic curve diagram of voltage margins and temperatures according to an embodiment of the present invention.

FIG. 4 is a schematic curve diagram of time sequence codes and temperatures according to an embodiment of the present invention. FIG. 5 is a schematic curve diagram of voltage margins and temperatures according to an embodiment of the present invention.

A change rate of a junction temperature inside a system chip varies with different temperatures, and a change in a time sequence is also different under different temperatures. Therefore, an output time sequence code changes. However, it takes a relatively long time to perform a voltage adjustment on an entire voltage adjustment loop, and a transient time sequence error may occur when an environment changes fiercely. Therefore, when a time sequence reference calibration code is selected according to a temperature code, the time sequence reference calibration code with a large value is considered to be selected because the time sequence code changes greatly for a range in which the temperature code is high, so that a large voltage margin is reserved and a best power reduction effect is achieved. That is, the time sequence reference calibration code may be understood as a standard voltage set in a current temperature range. When a temperature is high, a corresponding time sequence code changes greatly; and when a temperature is low, a corresponding time sequence code changes slightly. Therefore, only a very small voltage margin may be reserved in an adjustment voltage to be output for the system load when the time sequence code does not change fiercely; and a large voltage margin is reserved only when the time sequence code changes fiercely.

As shown in FIG. 4, a time sequence code change caused by a change dt in a unit temperature is different at different temperature points. The higher a temperature is, the more greatly a sequence code changes. As shown in FIG. 5, in a voltage margin diagram, a black dashed line indicates a voltage margin that does not experience an adaptive adjustment according to a temperature model. The higher a temperature is, the more greatly a corresponding time sequence code changes, and the larger a voltage margin for an adjustment voltage of a system load is. As may be seen from the figure, a ladder curve is a voltage margin after an adaptive adjustment is performed by using a temperature model, and a difference (that is, a shaded part) between the two is saved power consumption. Therefore, it may be discovered that the technical solution in this embodiment of the present invention may be better than a method in the prior art for saving power.

Figure 6:
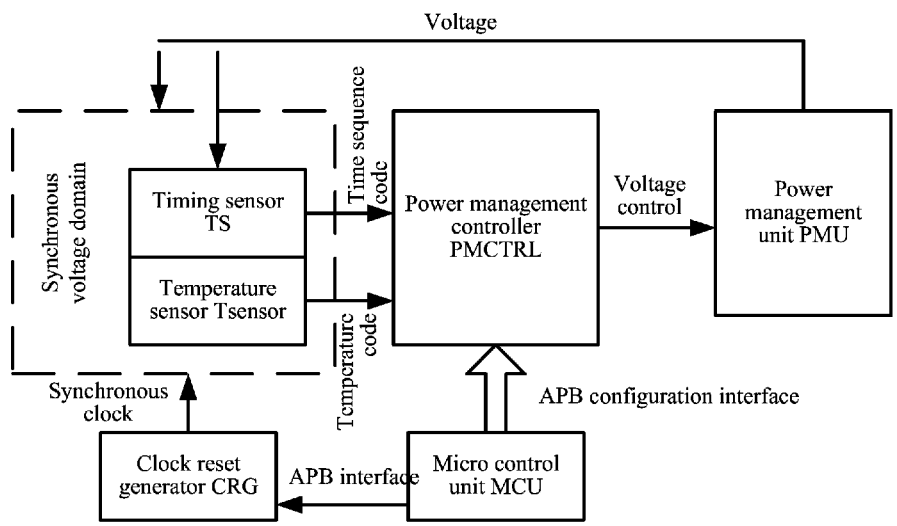
FIG. 6 is a second schematic diagram of a system for adjusting a voltage according to an embodiment of the present invention.

FIG. 6 is a second schematic diagram of a system for adjusting a voltage according to an embodiment of the present invention.

As shown in FIG. 6, the system includes a timing sensor TS (Timing Sensor) (corresponding to the time sequence monitoring unit in FIG. 5), a temperature sensor Tsensor (Temperature Sensor), a power management controller PMCTRL (Power Manager Control) (corresponding to the control logic module in FIG. 5), a micro control unit MCU (Microprocessor Control Unit) (corresponding to the performance prediction unit in FIG. 5), a clock reset generator CRG (Clock Reset Generator) (corresponding to the clock reset logic module in FIG. 5), and a power management unit PMU (Power Manage Unit).

The MCU determines a load of the current system, and configures a clock signal of the CRG through an advanced peripheral bus APB (Advanced Peripheral Bus) interface. When the load is high, the clock signal is configured as a high-frequency clock. When the load is low, the clock signal is configured as a low-frequency clock. After receiving configuration information, the CRG controls a clock operating frequency of a synchronous voltage domain, generates a synchronous clock, and outputs the synchronous clock to the TS. The MCU makes a performance prediction according to the system load, and configures a time sequence reference calibration code RCC (Reference Calibration Code), which corresponds to the current load, to be in the PMCTRL. When a high load is predicted, a time sequence reference calibration code corresponding to the high load is configured to be in a register group RCCs 1-5; and when a low load is predicted, a time sequence reference calibration code corresponding to the low load is configured to be in the register group RCCs 1-5. In internal logic of the PMCTRL, time sequence reference calibration code parameter registers RCCs 1-5 are included. After being started, the PMCTRL automatically selects a time sequence reference calibration code from a time sequence reference calibration code parameter register according to temperature code information.

Figure 7:
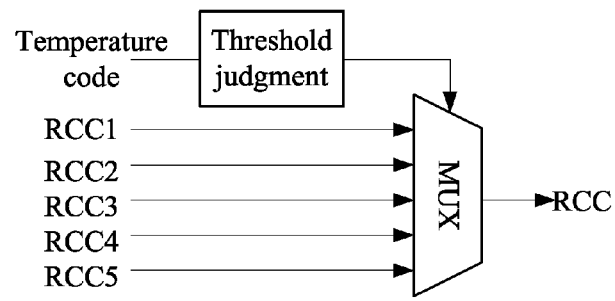
FIG. 7 is a schematic structural diagram of a multiplexing MUX in logic for selecting a time sequence reference calibration code according to an embodiment of the present invention.

FIG. 7 is a schematic structural diagram of a multiplexing MUX (Multiplexer) in logic for selecting a time sequence reference calibration code according to an embodiment of the present invention. The logic for selecting the time sequence reference calibration code according to this embodiment of the present invention is a multi-path selection MUX structure. That is, as a temperature changes, the Tsensor outputs different temperature codes, and a range to which a temperature code belongs is determined through threshold judgment. The PMCTRL selects one of RCCs 1-5 as an ultimate RCC according to the temperature code range. Different time sequence reference calibration codes are selected for different temperatures, and a specific time sequence reference calibration code may be acquired through a test. In a high-temperature condition, a time sequence code changes fiercely, and a large voltage margin is reserved. Therefore, a large time sequence reference calibration code is selected accordingly. Then, by comparing the time sequence code output by the TS with the selected ultimate RCC, the PMCTRL determines an adjustment voltage to be output, and the PMU adjusts a voltage according to the adjustment voltage output by the PMCTRL.

It may be discovered that according to the technical solution in this embodiment of the present invention, a temperature model adaptive voltage scaling technology is used, a temperature sensor is used to detect a temperature, and different time sequence reference calibration codes RCCs are adaptively selected according to a temperature range, thereby solving an issue in the AVS in the prior art that a voltage margin cannot be adjusted along with a change in an ambient temperature and further reducing system power consumption.

The foregoing describes in detail a method for adaptively adjusting a voltage in the embodiments of the present invention, and embodiments of the present invention accordingly provide a control apparatus and a system for adaptively adjusting a voltage.

Figure 8:
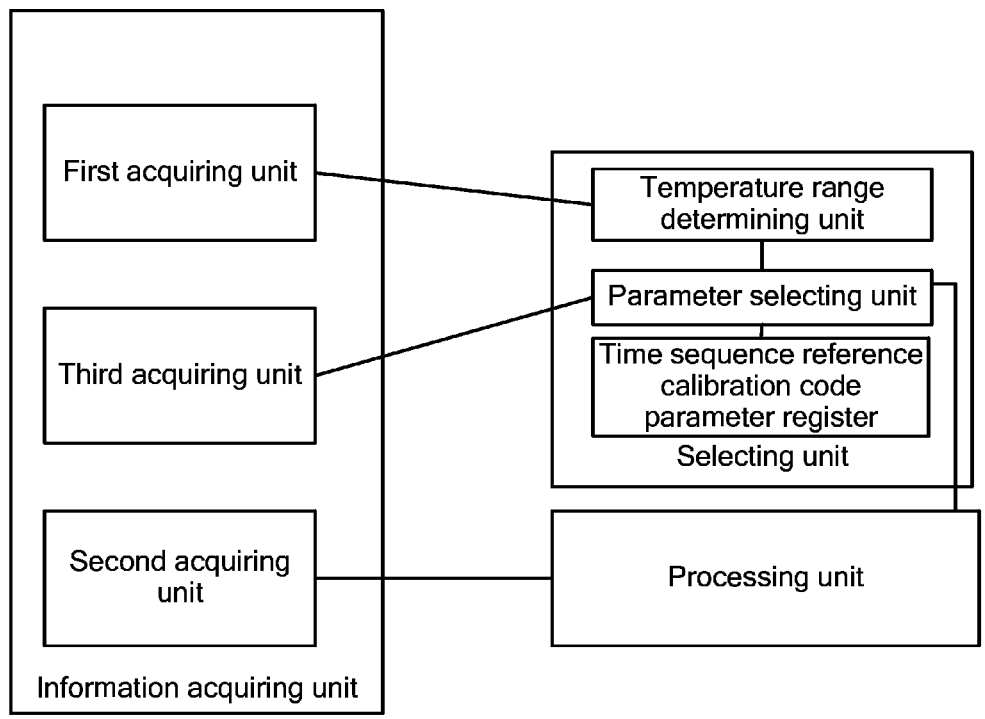
FIG. 8 is a schematic structural diagram of a control apparatus according to an embodiment of the present invention.

FIG. 8 is a schematic structural diagram of a control apparatus according to an embodiment of the present invention. The apparatus includes:

an information acquiring unit, adapted to acquire an internal temperature code of a system chip and a time sequence code of a system logic circuit, where the internal temperature code is detected by a temperature sensor and the time sequence code is output by a time sequence monitoring unit;

a selecting unit, adapted to select a time sequence reference calibration code from multiple configured time sequence reference calibration codes according to the acquired temperature code; and a processing unit, adapted to compare the acquired time sequence code with the selected time sequence reference calibration code, and determine, according to a comparison result, an adjustment voltage to be output for a system load, that is, raise a voltage of the system load if the acquired time sequence code is smaller than the time sequence reference calibration code, and lower a voltage of the system load if the acquired time sequence code is larger than the time sequence reference calibration code.

Further, the information acquiring unit may include:

a first acquiring unit, adapted to acquire the internal temperature code of the system chip, where the internal temperature code is detected by the temperature sensor;

a second acquiring unit, adapted to acquire the time sequence code of the system logic circuit, where the time sequence code is output by the time sequence monitoring unit; and a third acquiring unit, adapted to acquire the time sequence reference calibration code configured by the performance monitoring unit according to a prediction made for the system load.

Further, the selecting unit includes:

a temperature range determining unit, adapted to determine a range to which the acquired temperature code belongs; and a parameter selecting unit, adapted to select a corresponding time sequence reference calibration code from multiple configured time sequence reference calibration codes according to the range to which the temperature code determined by the temperature range determining unit belongs, where for a range in which a temperature code is high, a time sequence code changes greatly and a time sequence reference calibration code with a large numerical value may be selected, so that a large voltage margin is reserved accordingly for an adjustment voltage of the system load; and for a range in which a temperature code is low, a time sequence code changes slightly and a time sequence reference calibration code with a small numerical value may be selected, so that a small voltage margin is reserved accordingly for an adjustment voltage of the system load.

Further, the selecting unit may further include:

a time sequence reference calibration code parameter register, adapted to store a time sequence reference calibration code configured by the performance prediction unit according to a prediction made for the system load, where logic for selecting the time sequence reference calibration code is a multi-path selection structure; and the parameter selecting unit selects a corresponding time sequence reference calibration code from the time sequence reference calibration code parameter register with the multi-path selection structure according to the range to which the acquired temperature code belongs.

Figure 9:
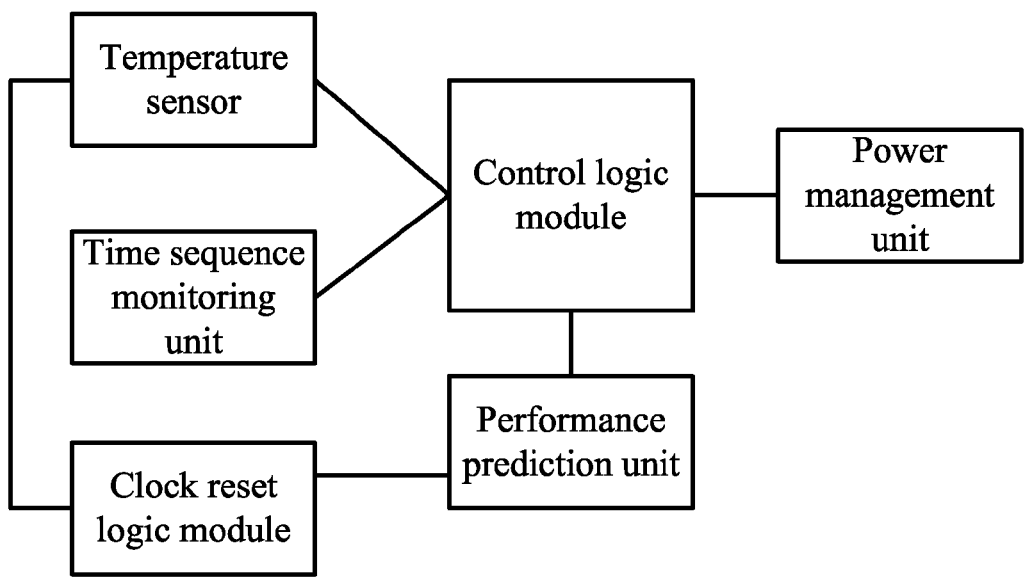
FIG. 9 is a schematic structural diagram of a system for adjusting a voltage according to an embodiment of the present invention.

FIG. 9 is a schematic structural diagram of a system for adjusting a voltage according to an embodiment of the present invention. The system includes:

a temperature sensor, adapted to detect a current temperature inside a system chip and output a temperature code;

a time sequence monitoring unit, adapted to monitor a path time sequence of a system logic circuit and output a time sequence code; and a control logic module, adapted to: acquire the internal temperature code of the system chip and the time sequence code of the system logic circuit, where the internal temperature code is detected by the temperature sensor and the time sequence code is output by the time sequence monitoring unit; select a time sequence reference calibration code from multiple configured time sequence reference calibration codes according to the acquired temperature code; and compare the acquired time sequence code with the selected time sequence reference calibration code and determine, according to a comparison result, an adjustment voltage to be output for a system load.

Further, the system further includes:

a performance prediction unit, adapted to configure the time sequence reference calibration code according to a prediction made for the system load.

Further, the system further includes:

a clock reset logic module, adapted to output a synchronous clock to the time sequence monitoring unit according to the prediction made by the performance prediction unit for the system load, so that the time sequence monitoring unit outputs the time sequence code after the acquired synchronous clock is adjusted.

Further, the system further includes:

a power management unit, adapted to adjust a voltage of the system load according to the adjustment voltage output by the control logic module.

It should be noted that, in a practical application, each unit or component of the foregoing apparatus and system embodiments may be an integration of any two or more of the each unit and component, or partial functions of each unit or component may be split on demand to be combined with another unit or component. In addition, the foregoing method embodiments may be implemented by computer programs, and these computer programs may be stored and solidified in a storage medium, such as a ROM, an optical disk, a flash memory, or a removable hard disk.

The foregoing descriptions are merely embodiments of the present invention, and the protection scope of the present invention is not limited thereto. All equivalent structural or process changes made according to the content of this specification and accompanying drawings in the present invention or by directly or indirectly applying the present invention in other relevant technical fields shall fall within the protection scope of the present invention.

What is claimed is:

1. A method for adaptively adjusting a voltage, the method comprising:
    acquiring an internal temperature code of a system chip and a time sequence code of a system logic circuit, wherein the internal temperature code is detected by a temperature sensor and the time sequence code is output by a time sequence monitoring unit;
    selecting a time sequence reference calibration code from multiple configured time sequence reference calibration codes according to the acquired temperature code;
    comparing the acquired time sequence code with the selected time sequence reference calibration code; and
    determining, according to a comparison result, an adjustment voltage to be output for a system load.

2. The method according to claim 1, further comprising making a prediction according to the system load and configuring the multiple time sequence reference calibration codes.

3. The method according to claim 1, wherein selecting the time sequence reference calibration code comprises:
    selecting a corresponding time sequence reference calibration code from the multiple configured time sequence reference calibration codes according to a range to which the acquired temperature code belongs.

4. The method according to claim 1, wherein acquiring the time sequence code comprises:
    acquiring a time sequence code output after the time sequence monitoring unit detects a time sequence of a key path of the system logic circuit.

5. The method according to claim 1, wherein comparing the acquired time sequence code with the selected time sequence reference calibration code and determining the adjustment voltage to be output for the system load comprise:
    comparing the acquired time sequence code with the selected time sequence reference calibration code;
    raising a voltage of the system load if the acquired time sequence code is smaller than the time sequence reference calibration code; and
    lowering a voltage of the system load if the acquired time sequence code is larger than the time sequence reference calibration code.

6. A control apparatus, comprising:
    an information acquiring unit, configured to acquire an internal temperature code of a system chip and a time sequence code of a system logic circuit, the internal temperature code being detected by a temperature sensor and the time sequence code being output by a time sequence monitoring unit;
    a selecting unit, configured to select a time sequence reference calibration code from multiple configured time sequence reference calibration codes according to the acquired temperature code; and
    a processing unit, configured to compare the acquired time sequence code with the selected time sequence reference calibration code and to determine, according to a comparison result, an adjustment voltage to be output for a system load.

7. The apparatus according to claim 6, wherein the selecting unit comprises:
    a temperature range determining unit, configured to determine a range to which the acquired temperature code belongs; and
    a parameter selecting unit, configured to select a corresponding time sequence reference calibration code from the multiple configured time sequence reference calibration codes according to the range that is determined by the temperature range determining unit.

8. The apparatus according to claim 7, wherein the selecting unit further comprises a time sequence reference calibration code parameter register, configured to store a time sequence reference calibration code configured by a performance prediction unit according to a prediction made for the system load, wherein logic for selecting the time sequence reference calibration code is a multi-path selection structure;
    wherein the parameter selecting unit selects a corresponding time sequence reference calibration code from the time sequence reference calibration code parameter register with the multi-path selection structure according to the range to which the acquired temperature code belongs.

9. A system for adaptively adjusting a voltage, the system comprising:
    a temperature sensor, configured to detect a current temperature inside a system chip and output a temperature code;
    a time sequence monitoring unit, configured to monitor a path time sequence of a system logic circuit and output a time sequence code; and
    a control logic module, configured to acquire the internal temperature code of the system chip and the time sequence code of the system logic circuit, the internal temperature code being detected by the temperature sensor and the time sequence code being output by the time sequence monitoring unit, the control logic module further configured to select a time sequence reference calibration code from multiple configured time sequence reference calibration codes according to the acquired temperature code, to compare the acquired time sequence code with the selected time sequence reference calibration code and to determine, according to a comparison result, an adjustment voltage to be output for a system load.

10. The system according to claim 9, further comprising a performance prediction unit, configured to configure the time sequence reference calibration code according to a prediction made for the system load.

11. The system according to claim 9, further comprising a power management unit, configured to adjust a voltage of the system load according to the adjustment voltage output by the control logic module.

* * * * *